(12) United States Patent  (10) Patent No.: US 8,809,818 B2
Murakami                  (45) Date of Patent:     Aug. 19, 2014

(54) EUV LIGHT SOURCE, EUV EXPOSURE APPARATUS, AND ELECTRONIC DEVICE MANUFACTURING METHOD

(75) Inventor: Katsuhiko Murakami, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/591,741

(22) Filed: Nov. 30, 2009

(65) Prior Publication Data

US 2010/0097593 A1 Apr. 22, 2010

Related U.S. Application Data

(63) Continuation of application No. PCT/JP2008/060064, filed on May 30, 2008.

(30) Foreign Application Priority Data

Jul. 6, 2007 (JP) ................................. 2007-178184

(51) Int. Cl.
*H05G 2/00* (2006.01)
(52) U.S. Cl.
USPC ..................................................... 250/504 R
(58) Field of Classification Search
USPC ..................................................... 250/504 R
See application file for complete search history.

(56) References Cited

U.S. PATENT DOCUMENTS

| 6,507,641 | B1 * | 1/2003 | Kondo et al. .................. 378/119 |
| 6,711,233 | B2 * | 3/2004 | Hertz et al. ................... 378/143 |
| 6,738,452 | B2 * | 5/2004 | McGregor et al. ............. 378/119 |
| 7,812,329 | B2 * | 10/2010 | Bykanov et al. ........... 250/504 R |
| 8,319,200 | B2 * | 11/2012 | Schimmel et al. ......... 250/504 R |
| 2004/0046949 | A1 * | 3/2004 | Ohgushi et al. .................. 355/53 |
| 2004/0183038 | A1 * | 9/2004 | Hiramoto et al. ......... 250/504 R |
| 2004/0200977 | A1 * | 10/2004 | Rieger et al. ................... 250/398 |
| 2006/0091328 | A1 * | 5/2006 | Kanazawa ................. 250/504 R |
| 2006/0098781 | A1 * | 5/2006 | Bloom et al. .................. 378/119 |
| 2006/0203965 | A1 * | 9/2006 | Zink ............................... 378/119 |
| 2006/0219959 | A1 * | 10/2006 | Hergenhan et al. ........ 250/504 R |
| 2007/0158577 | A1 * | 7/2007 | Tomie ......................... 250/423 P |
| 2007/0228298 | A1 * | 10/2007 | Komori et al. .............. 250/493.1 |
| 2007/0228299 | A1 * | 10/2007 | Ziener et al. ................ 250/503.1 |
| 2008/0067456 | A1 * | 3/2008 | Kloepfel et al. ........... 250/504 R |
| 2009/0206268 | A1 * | 8/2009 | Jonkers et al. ................ 250/375 |
| 2010/0051832 | A1 * | 3/2010 | Nishisaka et al. ......... 250/504 R |

FOREIGN PATENT DOCUMENTS

| EP | 1 775 755 A1 | 4/2007 |
| JP | A-2000-091095 | 3/2000 |
| JP | A-2001-108799 | 4/2001 |

(Continued)

OTHER PUBLICATIONS

Jun. 24, 2008 Search Report issued in International Patent Application No. PCT/JP2008/060064.

(Continued)

*Primary Examiner* — Jack Berman
*Assistant Examiner* — Jason McCormack
(74) *Attorney, Agent, or Firm* — Oliff PLC (57) ABSTRACT

Provided is an EUV light source which brings a target into the plasma state to radiate EUV light from the generated plasma. The target is one of a plurality of discrete targets. The surface area of each target is 1.5 times or more of that of a sphere which has the same material and the same mass as those of the target.

18 Claims, 5 Drawing Sheets

(56) References Cited

FOREIGN PATENT DOCUMENTS

| | | | |
|---|---|---|---|
| JP | 2006013033 A | * | 1/2006 |
| JP | A-2006-13033 | | 1/2006 |
| JP | A-2006-210157 | | 8/2006 |
| JP | A-2006-244837 | | 9/2006 |
| JP | 2007059373 A | * | 3/2007 |
| JP | A-2007-059373 | | 3/2007 |

OTHER PUBLICATIONS

Jan. 26, 2010 International Preliminary Report on Patentability issued in International Patent Application No. PCT/JP2008/060064.

Tomie, "Laser Produced Plasma Light Sources: Present Status of Laser Produced Plasma EUV Sources Development," The Journal of the Japan Society of Plasma Science and Nuclear Fushion Research, Jan. 5, 2003, pp. 234-239, vol. 79—No. 3, Japan (with translation).

Yasukazu Izawa, "Practical Applications of Advanced Semiconductor Manufacturing Technologies such as Development of EVU Light Sources", Leading Project of Ministry of Education, Culture, Sports, Science and Technology, Annual Working Papers in 2003, pp. 32-46, Mar. 2004.

May 14, 2013 Office Action issued in Japanese Patent Application No. 2007-178184 (w/translation).

Jan. 8, 2013 Office Action issued in Japanese Patent Application No. 2007-178184 (with Translation).

* cited by examiner

EUV LIGHT SOURCE, EUV EXPOSURE APPARATUS, AND ELECTRONIC DEVICE MANUFACTURING METHOD

CROSS-REFERENCE TO RELATED APPLICATIONS

This non-provisional application is a continuation application of and claims the benefit of International Application No. PCT/JP2008/060064, filed on May 30, 2008, the entire contents of which are incorporated herein by reference.

BACKGROUND

The present invention relates to an EUV light source that emits EUV light, an EUV exposure apparatus that uses the EUV light source, and a method for manufacturing an electronic device with the EUV exposure apparatus.

Due to the recent trend in miniaturization of semiconductor integrated circuits, an EUV exposure apparatus that uses EUV (Extreme Ultraviolet) light having a wavelength of about 5 to 50 nm has been proposed to improve the resolution of an optical system, which is restricted by the diffraction limit of the light.

In such an EUV exposure apparatus, the use of an EUV light source capable of supplying EUV light at a high output power is required for high throughput. In particular, as a high output power EUV light source, a light source that plasmatizes a target material including Sn and radiates EUV light has been discussed (for example, refer to "Laser Generation Plasma Light Source", Toshinao Tomie; The Journal of the Japan Society of Plasma Science and Nuclear Fusion Research Vol. 79, No. 3 (2003), pp. 234-239.).

When using a metal such as Sn as the target material, a high density solid target would generate plasma with a high ion density. This increases self-absorption of the EUV light and lowers the output power. On the other hand, it is known that when using a low density solid target, light emission components are reduced at a wavelength band outside the peak of the emission spectrum. This improves the conversion efficiency to the useful EUV light wavelength.

SUMMARY

When using metal such as Sn as the target material for the EUV light source as described above, it is preferable that a density-decreased target be supplied in order to generate EUV light having a high output power. However, continuous supply of a density-decreased target suitable for such an EUV light source is actually difficult.

The present invention aims to solve the problems of the related art. It is an object of the present invention to provide an EUV light source capable of supplying high output power EUV light, an EUV exposure apparatus using such an EUV light source, and a method for manufacturing an electronic device with the EUV exposure apparatus.

One aspect of the present invention provides an EUV light source configured to plasmatize a target to radiate EUV light from the generated plasma. The target is one of a plurality of discrete targets, each having a surface area that is at least 1.5 times greater than that of a sphere formed from the same material and having the same mass.

A further aspect of the present invention is an EUV exposure apparatus including the above-described EUV light source, an illumination optical system which irradiates an irradiated surface with EUV light radiated from the EUV light source, and a projection optical system which exposes and transfers EUV light via the irradiated surface onto a photosensitive substrate.

Another aspect of the present invention is an electronic device manufacturing method including a lithography step, in which the above-described EUV exposure apparatus is used.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

Figure 1:
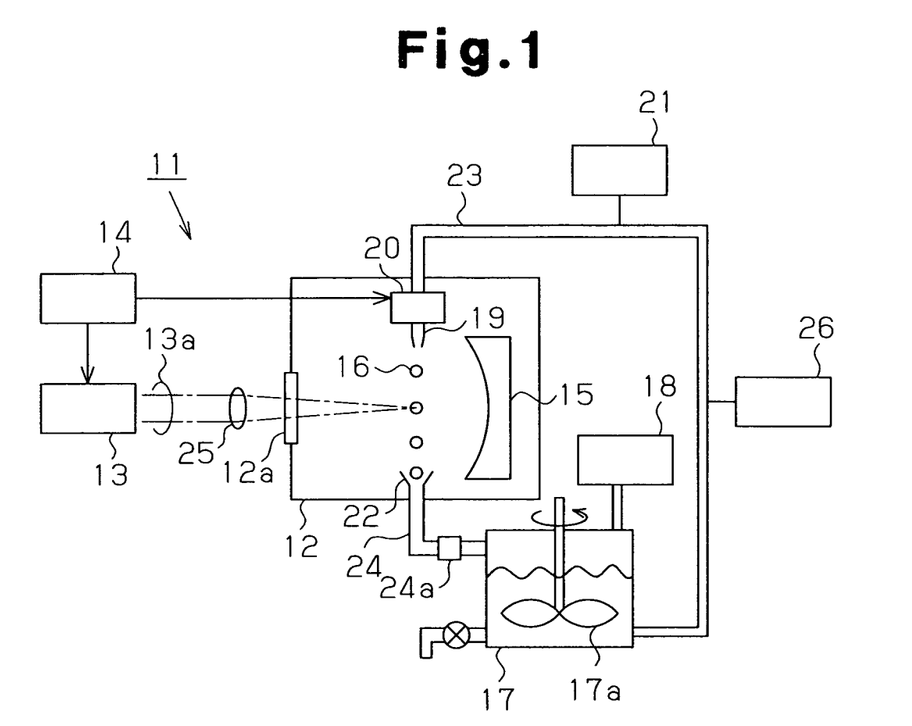
FIG. 1 is a schematic diagram showing the structure of an EUV light source in a first embodiment.

FIG. 1 is a schematic diagram showing the structure of an EUV light source unit in a first embodiment. In the first embodiment, an example of a laser plasma (LPP: Laser Produced Plasma) light source using a droplet target will be described.

As shown in FIG. 1, an EUV light source unit 11 includes a vacuum chamber 12, target supply units (17, 18, 19, 20, 21, 22, 23, and 24), a laser light source 13 such as a carbon dioxide gas laser light source, a control unit 14, and a converging mirror 15. The vacuum chamber 12 includes a glaser entrance window 12a, into which laser light 13a from the laser light source 13 enters, and an EUV light exit window, which guides EUV light 16a to an illumination optical system (in FIG. 1, the illumination optical system and EUV light exit window are not shown). During operation of the EUV light source unit 11, a turbo molecular pump (not shown) keeps the interior of the vacuum chamber 12 at a vacuum. Here, vacuum refers to state in which the pressure is lower than atmospheric pressure and is less than or equal to approximately 1 Pa (Pascal) under room temperature (about 25° C.)

The target supply unit supplies target material into the vacuum chamber 12 and continuously generates discrete droplet targets 16. The target supply unit includes a tank 17, a pressurized gas supply unit 18, a nozzle 19 and vibration mechanism 20, a gas injection unit 21, and a target recovery mechanism 22. The nozzle 19, the vibration mechanism 20, and the target recovery mechanism 22 are each arranged in the vacuum chamber 12.

The tank 17 contains a molten and liquefied target material. An alloy containing tin (Sn) is used as the target material in the first embodiment to generate the EUV light 16a with a wavelength near 13.5 nm, which is suitable for EUV lithography. The tank 17 is heated by a heating mechanism (not shown) so that the Sn alloy does not solidify.

The tank 17 is connected to the pressurized gas supply unit 18. Pressurized xenon gas is drawn from the pressurized gas supply unit 18 into the tank 17 as a pressurizing gas for the target material. Furthermore, the tank 17 includes an agitation mechanism 17a with vanes rotated in a liquid. The agitation mechanism 17a agitates the molten target material with the vanes to uniformly dissolve some of the xenon gas in the target material. In the first embodiment, the pressurization of the target material dissolves more gas in the target material compared to an atmospheric pressure state. The tank 17, the agitation mechanism 17a, and the pressurized gas supply unit 18 serve as an example of a gas mixing unit.

A first pipe 23 connected to the tank 17 is also connected to the nozzle 19 by the vibration mechanism 20. Molten target material is sent from the tank 17 to the nozzle 19 through the first pipe 23. The first pipe 23 preferably includes a solidification prevention mechanism 26, which heats or pressurizes the pipes so that the molten target material does not solidify. The solidification prevention mechanism 26 is unnecessary if the melting point of the target material is low enough. The gas injection unit 21 (second gas mixing unit), which injects pressurized xenon gas into the target material, is connected to a midway location of the first pipe 23. The gas injection unit 21 injects further pressurized gas into the target material flowing through the first pipe 23. The gas injection unit 21 may be omitted if the pressurized xenon gas can be sufficiently dissolved in the target material at the pressurized gas supply unit 18.

The molten target material is discretely ejected from the distal end of the nozzle 19 and into the vacuum chamber 12 in a state mixed with xenon gas. The vibration mechanism 20 controls the timing for ejecting liquefied Sn alloy by vibrating the nozzle 19 in the liquid ejection direction. The nozzle 19 is arranged to eject the target material towards a converging point position of the laser light, which will be described later (see FIG. 2).

The liquefied target material (Sn alloy) ejected from the nozzle 19 is generally spherical due to surface tension and cooled in vacuum until it substantially solidifies so as to form the droplet targets 16. The pressurized xenon gas mixed in the target material is substantially vaporized as it is released from pressure when ejected out of the nozzle 19. When the xenon gas is released from pressure, a large number of pores or holes form at the surface of or inside the droplet targets 16. Therefore, the target supply unit of the first embodiment is capable of continuously supplying porous droplet targets 16 having decreased density similar to pumice rock.

The amount of a single droplet target 16 is preferably adjusted to be the maximum amount that can be plasmatized and consumed by the irradiation of a single pulse of the laser light 13a, which will be described later. If the droplet target 16 is too large, it may not be plasmatized and the target residue may form debris. If the droplet target 16 is too small, this would decrease the efficiency of conversion to the EUV light 16a. The pressurizing pressure in the target supply unit, the diameter of the nozzle 19, and the temperature of the target material are adjusted so that the droplet targets 16 have a constant size and are supplied at a fixed interval. In the first embodiment, adjustments are made so that the droplet targets 16 have a diameter of about 50 μm.

The target residue is collected by the target recovery mechanism 22. The target recovery mechanism 22 is connected to the tank 17 by a second pipe 24 to return the recovered target residue to the tank 17 so that it is heated and melted again for reuse. The second pipe 24 includes a check valve 24a so that the vapor in the tank 17 does not flow back into the vacuum chamber 12.

It is preferable that a heating mechanism (not shown) heat the second pipe 24 so that liquefied liquid Sn alloy does not solidify in the middle of the second pipe 24. A heating mechanism does not need to be used for the pipes as long as the melting point of the Sn alloy is sufficiently low.

The laser light source 13 irradiates the pulse laser light 13a (wavelength 1.06 μm). The laser light 13a enters the vacuum chamber 12 from the laser entrance window 12a through a converging lens 25.

The control unit 14 controls the target supply unit and the laser light source 13 in a centralized manner. Specifically, the control unit 14 supplies the droplet targets 16 from the nozzle 19 of the target supply unit. The control unit 14 also monitors the positions of the droplet targets 16 with a monitor mechanism (not shown) and emits the laser light 13a from the laser light source 13 in synchronism with the droplet target 16 that reaches the converging point position of the laser light 13a. This plasmatizes the droplet target 16 irradiated by the laser light 13a, and light including the EUV light 16a is radiated from the generated plasma.

The converging mirror 15, which is arranged in the vacuum chamber 12, functions to converge the EUV light 16a generated from the plasma and guide the EUV light 16a to the illumination optical system. The converging mirror 15 has a spheroidal reflection surface, which is coated by a Mo/Si multilayer film. The converging mirror 15 is also arranged such that a single focal point on the spheroidal surface corresponds to the converging point position of the laser light 13a (generation position of EUV light). Therefore, the EUV light 16a reflected by the converging mirror 15 is converged at another focal point and guided to the illumination optical system.

Figure 2:
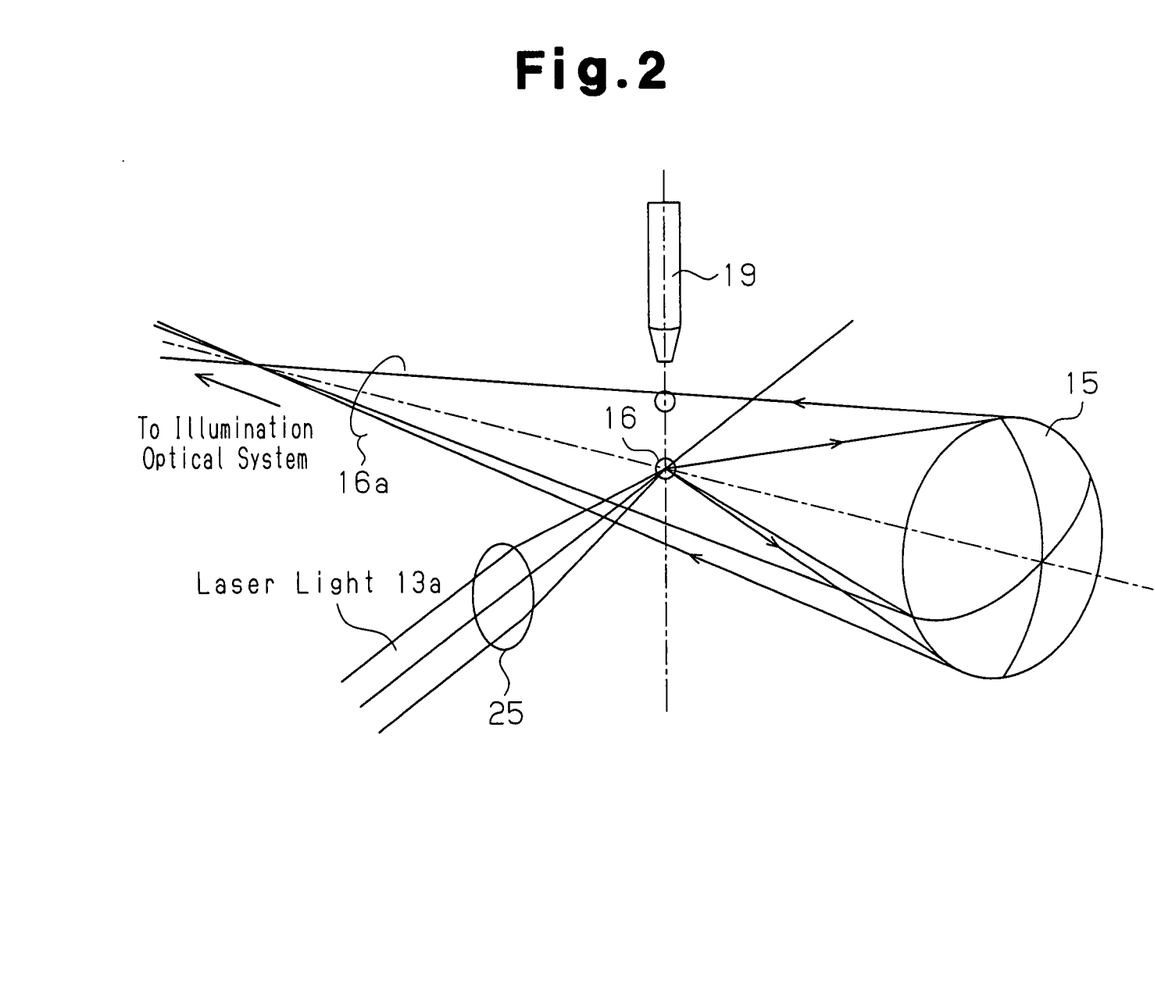
FIG. 2 is a diagram showing the positional relationship of a nozzle, laser light, and converging mirror in the first embodiment.

FIG. 2 is a diagram showing the positional relationship of the nozzle 19, the laser light 13a, and the converging mirror 15 in the first embodiment. In FIG. 1, the EUV light 16a reflected by the converging mirror 15 seems to interfere with the laser entrance window 12a and the like. Actually, the center axis of the nozzle 19, the center axis of the laser light 13a, and the axis of the main light beam of the EUV light 16a reflected by the converging mirror 15 are arranged to be orthogonal to one another, as shown in FIG. 2. Thus, the EUV light 16a does not interfere with the laser entrance window 12a and the like.

In the present embodiment, the conversion efficiency to the EUV light 16a is improved by using the density-decreased target. Thus, in the present embodiment, the conversion efficiency is improved by forming recesses and projections or pores and holes in the target. In particular, the surface area of the density-decreased target is preferably at least 1.5 times greater than the surface area of a sphere formed from the same material and having the same mass as the target. If the surface area of the density-decreased target is less than 1.5 times greater, sufficient conversion efficiency may not be obtained. In order to obtain further preferable conversion efficiency, the surface area of the density-decreased target is preferably at least 2.5 times greater than the surface area of a sphere formed from the same material and having the same mass as the target. The surface area in the present embodiment includes not only the area of the surface exposed at the outermost surface of an object such as the target but also the area of the surfaces of pores and holes formed in the object.

The target in the present embodiment may be a target having the shape of a flake, a bar, pumice rock, and the like.

The advantages of the first embodiment will now be discussed. In the first embodiment, pressurized xenon gas is mixed in the Sn alloy of the target material. When the target material is ejected out of the nozzle 19, a large number of pores and holes form in the substantially solidified target as the xenon gas is released from pressure. Thus, in the first embodiment, the density-decreased droplet target 16 is easily continuously supplied, and the EUV light source has a higher conversion efficiency.

In particular, the xenon gas used in the first embodiment is inactive gas and thus has a low reactivity. This lowers the probability of the xenon gas therefore contaminating the converging mirror 15 and the like. Further, the xenon gas contributes to the emission of light in the EUV wavelength band as the target material and thereby may be expected to further improve the output power of the EUV light source.

Figure 3:
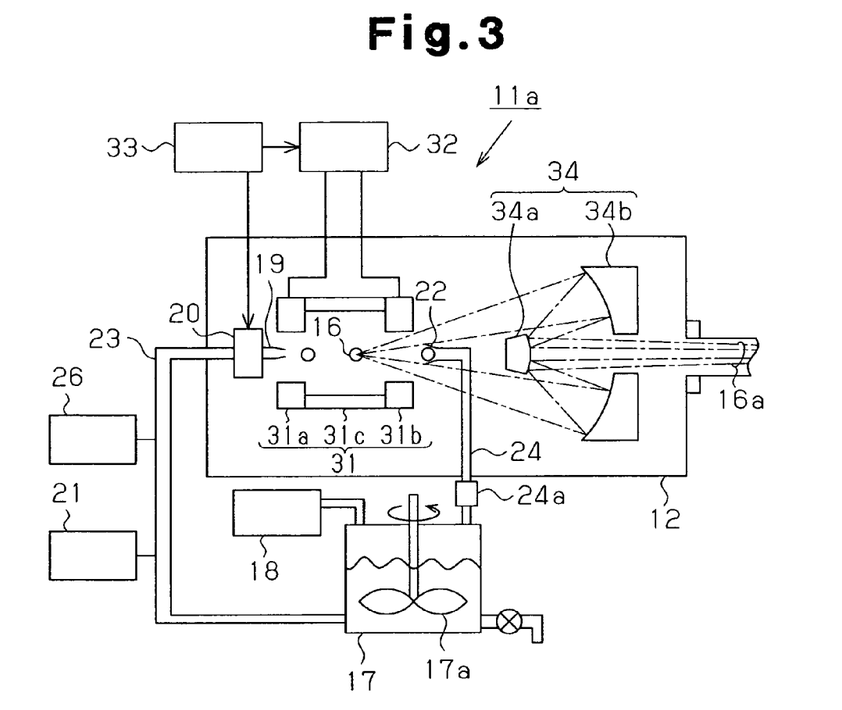
FIG. 3 is a schematic diagram showing the structure of an EUV light source unit in a second embodiment.

FIG. 3 is a schematic diagram showing the structure of an EUV light source unit (11a) in a second embodiment. In the description of the second embodiment, same reference numerals are added to parts that are the same as the first embodiment and will not be described again.

The second embodiment is an example of a discharge plasma (DPP: Discharge Produced plasma) light source using the droplet targets 16 in the same manner as in the first embodiment. FIG. 3 shows a EUV light source unit 11a including a vacuum chamber 12, target supply units (17 to 24), a discharge plasma light source 31, a high voltage power supply 32, a control unit 33, and a converging optical system 34. The nozzle 19 and target recovery mechanism 22 of the target supply unit, the discharge plasma light source 31, and the converging optical system 34 are arranged in the vacuum chamber 12. In the second embodiment, $CO_2$ gas is used as the gas mixed with the target material, and the droplet target 16 have a diameter set to about 100 μm.

The nozzle 19 of the target supply unit in the second embodiment has an ejection port, the direction of which is set so that the droplet targets 16 pass through the discharge space of the discharge plasma light source 31. The target recovery mechanism 22 is spaced apart from the nozzle 19 with the discharge plasma light source 31 located therebetween.

The discharge plasma light source 31 is a Z-pinch discharge plasma light source including a disk-shaped electrode (anode) 31a through which a hole extends, an identically shaped electrode (cathode) 31b, and a tubular insulating body 31c connecting the electrodes 31a and 31b. The electrodes 31a and 31b are each connected to the high voltage power supply 32. When a high voltage pulse is applied between the electrodes 31a and 31b, a discharge plasmatizes the substance (droplet target 16) in the space between the electrodes 31a and 31b, and light including the EUV light 16a is radiated.

The control unit 33 synchronously controls the target supply unit and the high voltage power supply 32 so that a high voltage pulse is applied to the electrodes 31a and 31b when a droplet target 16 reaches a center position in the discharge space.

The converging optical system 34 functions to converge the EUV light 16a generated from the plasma and guide the EUV light 16a to the illumination optical system. The converging optical system 34 is a Schwarzschild optical system including two concentric spherical reflection surfaces 34a and 34b. Each of the reflection surfaces 34a and 34b is coated with a Mo/Si multilayer film.

Figure 4:
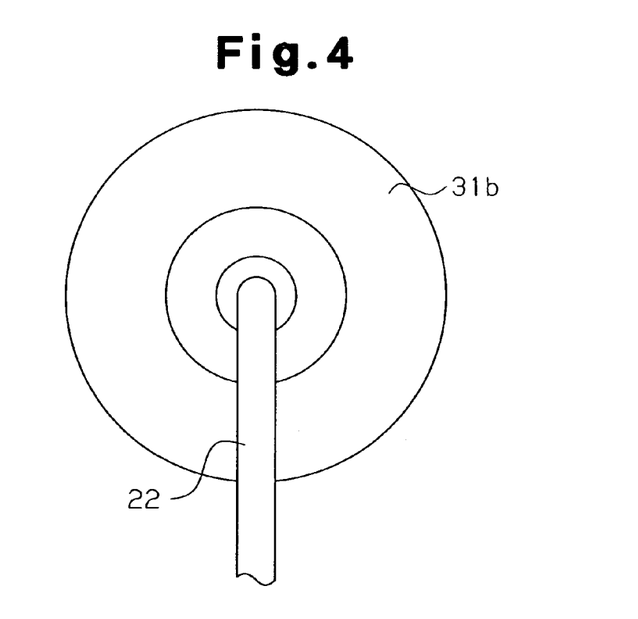
FIG. 4 is a diagram showing the positional relationship of a target recovery mechanism and a discharge plasma light source.

FIG. 4 is a diagram showing the positional relationship of the target recovery mechanism 22 in the target supply unit and the discharge plasma light source 31. In the second embodiment, the center axis of the hole of the electrode 31b is substantially aligned with the center axis of the opening of the target recovery mechanism 22.

The target recovery mechanism 22 shields part of the EUV light 16a generated from the discharge plasma light source 31. However, the Schwarzschild optical system of the converging optical system 34 is a central obscuration optical system that cannot converge light rays near the optical axis. In the second embodiment, EUV light dissipation is minimized by arranging the target recovery mechanism 22 in the central obscuration of the Schwarzschild optical system as much as possible. A Walter optical system may be used in lieu of the Schwarzschild optical system as the converging optical system of the second embodiment. The Walter optical system is also a central obscuration optical system and minimizes EUV light dissipation caused by the dissipation with the same arrangement.

The use of the droplet targets 16 having decreased density in the structure of the second embodiment obtains substantially the same advantages as the first embodiment.

Figure 5:
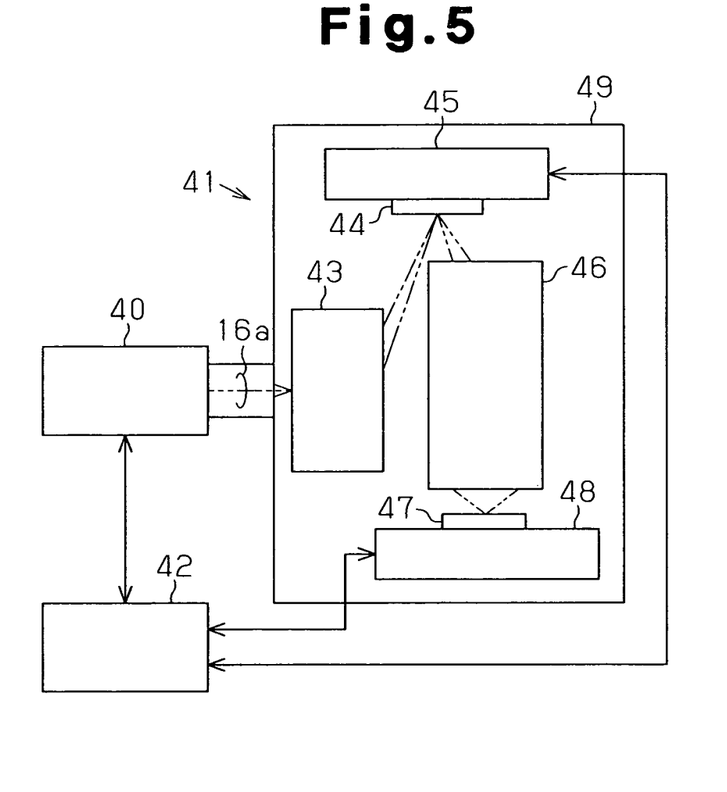
FIG. 5 is a schematic diagram showing the structure of an EUV exposure apparatus according to the present invention.

One embodiment of an EUV exposure apparatus in accordance with the present invention will be described below. FIG. 5 is a schematic diagram showing the structure of the EUV exposure apparatus. The EUV exposure apparatus includes an EUV light source unit 40 (11, 11a) selected from the EUV light source units of the above-described first embodiment and second embodiment, an exposure unit 41, and a controller 42.

The exposure unit 41 includes an illumination optical system 43, a mask stage 45 for suspending and supporting a reflective mask 44 arranged on an irradiated surface, a projection optical system 46, a wafer stage 48 on which a wafer 47 is set, and a vacuum chamber 49 for accommodating these components.

The illumination optical system 43, which includes a reflection mirror and the like for a fly eye optical system, shapes the EUV light from the EUV light source unit 40 and guides the EUV light to the reflective mask 44. A reflective film including a multilayer film is formed on the reflection surface of the reflective mask 44. The reflective film includes a mask pattern formed in correspondence with the pattern transferred onto the wafer 47. The projection optical system 46, which includes a plurality of reflection mirrors, reduces the EUV light reflected by the reflective mask 44 to a predetermined reduction magnification (e.g., ¼) and projects the EUV light onto the wafer 47. The EUV light has low transmissivity with respect to the atmosphere, and thus keeps the optical path through which the EUV light passes in a vacuum state.

During an exposure operation, the EUV light 16a from the EUV light source unit 40 enters the reflective mask 44 through the illumination optical system 43. The reflected light from the reflective mask 44 is projected onto the wafer 47 through the projection optical system 46. This exposes a pattern on the wafer 47, to which resist is applied. In the present embodiment, the present invention is applied to a scanning exposure apparatus that exposes a pattern onto the wafer 47 while moving the reflective mask 44 and the wafer 47. The operation of the EUV light source unit 40, the mask stage 45, and the wafer stage 48 are all controlled by the controller 42.

In the exposure apparatus of the present embodiment, an EUV light source according to an embodiment of the present invention is used, and high output power EUV light may be supplied. This improves the throughput of the exposure apparatus.

Figure 6:
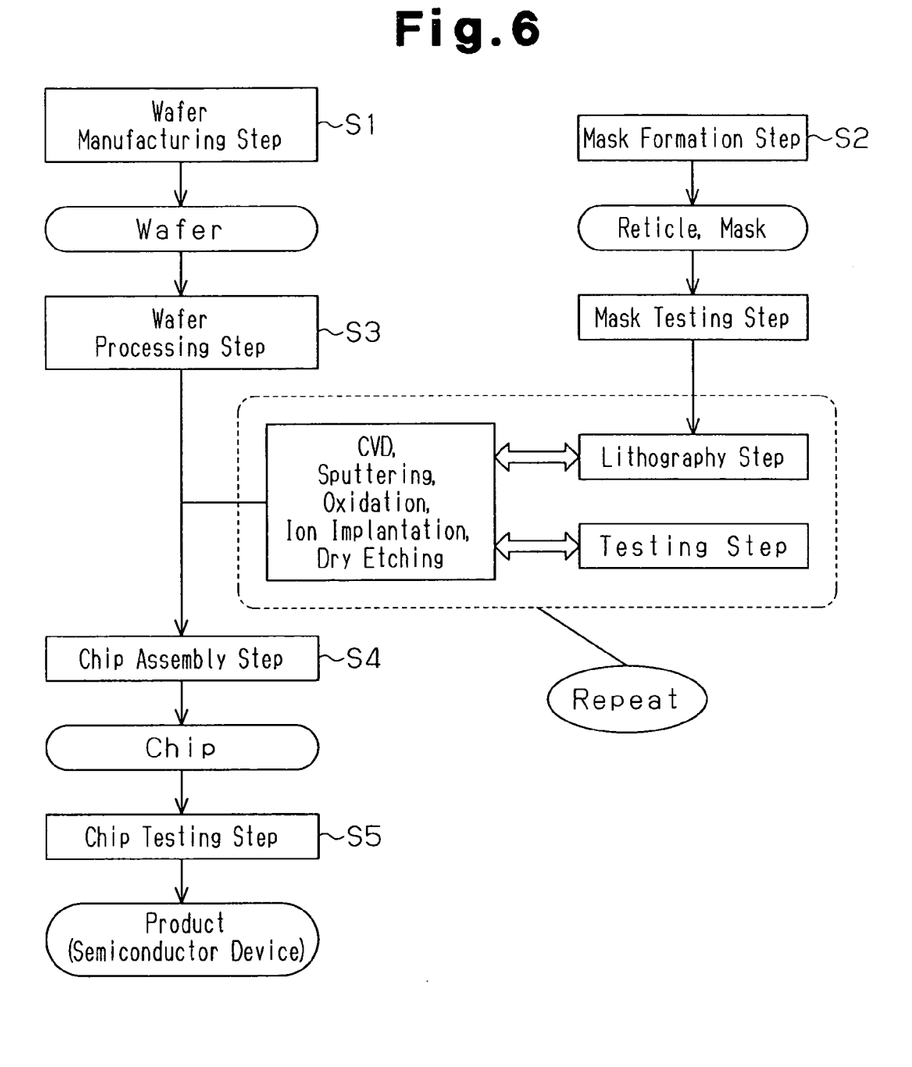
FIG. 6 is a flowchart showing one example of a method for manufacturing a semiconductor device according to the present invention.

One embodiment of a method for manufacturing a semiconductor device in accordance with the present invention will now be discussed. FIG. 6 is a flowchart showing one example of a semiconductor device manufacturing method in accordance with the present invention. The manufacturing steps in the example of FIG. 6 include the main steps described below.

(S1) Wafer manufacturing step for manufacturing a wafer (or wafer preparing step for preparing a wafer).

(S2) Mask formation step for forming a mask used for exposure (or mask preparing step for preparing a mask).

(S3) Wafer processing step for performing a necessary processing process on the wafer.

(S4) Chip assembly step for cutting out chips formed on the wafer one at a time and having the chips become operable.

(S5) Chip testing step for testing the chip.

Each of these main steps further includes a number of sub-steps.

Among these main steps, the main step that significantly affects the performance of the semiconductor device is the wafer processing step. In this step, the designed circuit patterns are sequentially stacked on the wafer to form many chips that operate as a memory and an MPU. The wafer processing step includes the sub-steps listed below.

(1) Thin-film formation step for forming a metal thin-film and the like for forming a dielectric thin-film or wiring, which is used as an insulating layer, or an electrode portion (by performing CVD, sputtering, or the like).

(2) Oxidation step for oxidizing the thin-film layer and wafer substrate.

(3) Lithography step for forming the pattern of a resist with a mask (reticle) to selectively process the thin-film layer, the wafer substrate, and the like.

(4) Etching step for processing the thin-film layer and substrate in accordance with the resist pattern (e.g., using dry etching technique).

(5) Ion implantation and diffusion step.

(6) Resist removal step.

(7) Testing step for testing further processed wafer.

The wafer processing step is repeatedly performed for a number of times that is in accordance with the necessary number of layers to manufacture the semiconductor device as designed.

In the manufacturing method of the semiconductor device of the present embodiment, the EUV exposure apparatus in one embodiment in accordance with the present invention is used in the lithography step. Thus, in the manufacturing method of the semiconductor device of the present embodiment, a fine line width pattern is exposed with a high throughput, and the semiconductor device is efficiently manufactured.

[Supplementary Note of Embodiment]

(1) In the above-described embodiment, an alloy containing tin (Sn) is selected as the target material. However, tin, tungsten, tantalum, gold, lithium, or an alloy containing any of these components may be used as the target material in the present invention.

(2) In the above-described embodiment, xenon or carbon dioxide is selected as the gas mixed with the target material. However, other gases may be mixed into the target material. The gas mixed into the target material in the present invention is preferably an inactive gas such as nitrogen, helium, argon, krypton, xenon, and neon, or gas having an emission spectrum at or near 13 nm (oxygen, carbon dioxide, xenon, etc.).

(3) In the above-described embodiment, an example of the exposure apparatus for exposing a circuit pattern onto the wafer and manufacturing a semiconductor device has been illustrated and described. However, the present invention is not limited to such an example. For example, the present invention is obviously applicable to an exposure apparatus for forming a circuit pattern (pixel, transparent electrode, thin-film transistor, etc.) on a glass substrate for a liquid crystal type or plasma type flat display device etc., or a method for manufacturing the above-devices.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. An EUV light source configured to plasmatize a target to radiate EUV light from a generated plasma, the EUV light source comprising:
   a gas dissolving unit which dissolves gas that is in a pressurized state in a target material that is in a molten state, wherein the gas is at an elevated pressure above atmospheric pressure when dissolved in the target material;
   a nozzle which ejects a liquefied target material in which the pressurized gas is dissolved to generate the target, and
   a laser light source that emits laser light to irradiate the liquefied target material ejected from the nozzle to plasmatize the liquefied target material.

2. The EUV light source according to claim 1, wherein the gas dissolving unit includes a mechanism configured to melt the target material, pressurize the gas, and agitate the molten target material and the gas.

3. The EUV light source according to claim 2, wherein the gas dissolving unit is configured to inject the pressurized gas into the molten target material.

4. The EUV light source according to claim 1, wherein the target material is liquefied target material, and the EUV light source includes a target supply unit that includes a pipe which connects the nozzle and the gas dissolving unit to feed the liquefied target material to the nozzle.

5. The EUV light source according to claim 4, wherein the pipe includes a mechanism configured to heat or pressurize the liquefied target material flowing through the pipe.

6. The EUV light source according to claim 4, wherein the target supply unit includes a second gas dissolving unit which dissolves the gas in a pressurized state in the liquefied target material between the nozzle and the gas dissolving unit.

7. The EUV light source according to claim 1, wherein the gas includes at least one of nitrogen, helium, argon, krypton, xenon, neon, oxygen, and carbon dioxide.

8. The EUV light source according to claim 1, wherein the target includes at least one of tin, tungsten, tantalum, gold, and lithium.

9. The EUV light source according to claim 1, wherein a surface area of the target is at least 2.5 times greater than a surface area of a sphere formed from a same material and a same mass as the target.

10. The EUV light source according to claim 9, wherein:
the nozzle is configured to eject predetermined amounts of pressurized liquefied target material in which the gas is dissolved toward a converging point position of the laser light in a depressurized space to continuously generate a plurality of discrete porous droplet targets with a constant size so that the plurality of discrete porous droplet targets pass through the converging point position one at a time; and the surface area of the target is a surface area of each discrete porous droplet target of the plurality of discrete porous droplet targets.

11. An EUV exposure apparatus comprising:

an EUV light source which plasmatizes a target to radiate EUV light from a generated plasma, wherein the EUV light source includes:

a gas dissolving unit which dissolves gas that is in a pressurized state in a target material that is in a molten state, wherein the gas is at an elevated pressure above atmospheric pressure when dissolved in the target material;

a nozzle which ejects a liquefied target material in which the pressurized gas is dissolved to generate the target;

a laser light source that emits laser light to irradiate the liquefied target material ejected from the nozzle to plasmatize the liquefied target material;

an illumination optical system which irradiates an irradiated surface with the EUV light radiated from the EUV light source; and a projection optical system which exposes and transfers the EUV light via the irradiated surface onto a photosensitive substrate.

12. An electronic device manufacturing method comprising:

dissolving gas that is in a pressurized state in a target material that is in a molten state, wherein the gas is at an elevated pressure above atmospheric pressure when dissolved in the target material; thereafter ejecting a liquefied target material in which the pressurized gas is dissolved to generate a target;

emitting laser light to irradiate the ejected liquefied target material to plasmatize the ejected liquefied target material to radiate EUV light; and exposing the EUV light onto a photosensitive substrate with an exposure apparatus to manufacture an electronic device.

13. The EUV light source according to claim 1, wherein the target material includes gas which is substantially vaporized when released from pressure.

14. The EUV light source according to claim 1, wherein the target material includes gas which is substantially vaporized in a vacuum.

15. The EUV light source according to claim 1, wherein the target material includes a gas uniformly dissolved in the target material.

16. The EUV light source according to claim 1, wherein the target includes at least one of pores and holes formed at a surface of the target and inside the target when the pressurized gas dissolved in the liquefied target material is released from pressure.

17. The EUV light source according to claim 1, wherein the target has a surface area that is at least 1.5 times greater than a surface area of a sphere formed from a same material and having a same mass as the target.

18. The EUV light source according to claim 17, wherein:

the nozzle is configured to eject predetermined amounts of pressurized liquefied target material in which the gas is dissolved toward a converging point position of the laser light in a depressurized space to continuously generate a plurality of discrete porous droplet targets with a constant size so that the plurality of discrete porous droplet targets pass through the converging point position one at a time; and the surface area of the target is a surface area of each discrete porous droplet target of the plurality of discrete porous droplet targets.

* * * * *